United States Patent
Kachi et al.

(10) Patent No.: US 8,217,648 B2
(45) Date of Patent: Jul. 10, 2012

(54) MAGNETIC RESONANCE IMAGING APPARATUS AND SCANNING-CONDITION SETTING METHOD

(75) Inventors: Junichi Kachi, Otawara (JP); Naoyuki Furudate, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 861 days.

(21) Appl. No.: 12/348,039

(22) Filed: Jan. 2, 2009

(65) Prior Publication Data

US 2009/0175524 A1 Jul. 9, 2009

(30) Foreign Application Priority Data

Jan. 8, 2008 (JP) .................. 2008-001632

(51) Int. Cl.
*G01V 3/00* (2006.01)

(52) U.S. Cl. ........................... 324/307; 324/309

(58) Field of Classification Search .......... 324/300–322; 600/407–445

See application file for complete search history.

(56) References Cited

U.S. PATENT DOCUMENTS

| 6,906,826 B1 * | 6/2005 | Kuwata et al. ............. 358/1.9 |
| 8,008,918 B2 * | 8/2011 | Sugiura ..................... 324/318 |
| 2010/0321016 A1 * | 12/2010 | Sugiura ..................... 324/307 |

FOREIGN PATENT DOCUMENTS

| JP | 11-47109 | 2/1999 |
| JP | 2006-255189 | 9/2006 |

* cited by examiner

*Primary Examiner* — Brij Shrivastav
(74) *Attorney, Agent, or Firm* — Nixon & Vanderhye PC

(57) ABSTRACT

In a console device that controls an Magnetic Resonance Imaging (MRI) apparatus, a preset-information storage unit stores preset information including information about a plurality of scanning parameters that are grouped based on an instruction from an operator, and a scanning-condition setting unit sets scanning conditions based on parameter values of the scanning parameters that are grouped in the preset information stored by the preset-information storage unit.

20 Claims, 11 Drawing Sheets

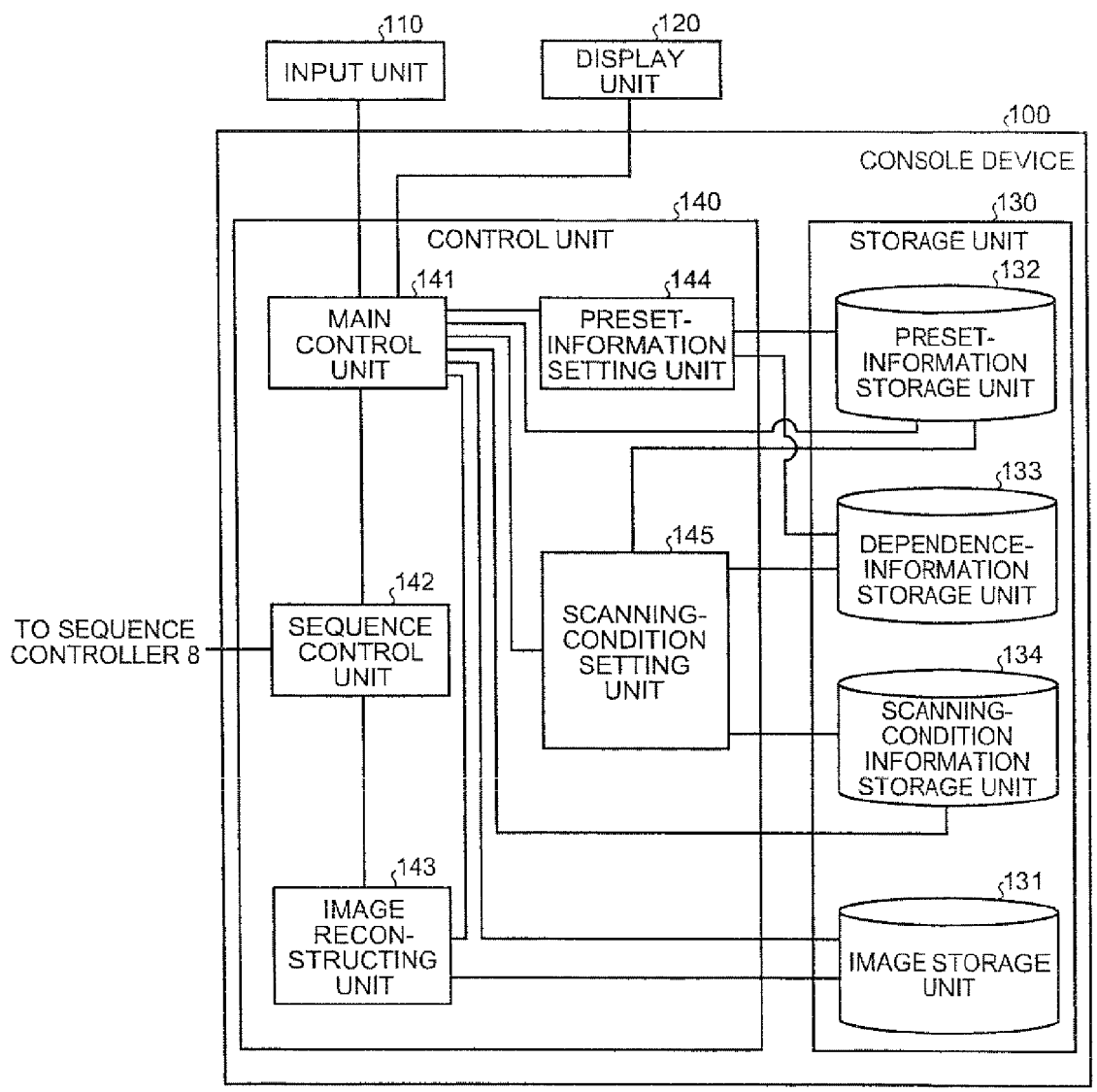

FIG.3

| PRESET NAME | SEQUENCE CATEGORY | SEQUENCE | PRESET TYPE | TE SE-LECTION | TE VAL-UE | TR SE-LECTION | TR VAL-UE | IMAGING FLIP ANGLE SE-LECTION | IMAGING FLIP ANGLE VAL-UE | IMAGING FLOP ANGLE SE-LECTION | IMAGING FLOP ANGLE VAL-UE | INVERSION PULSE SE-LECTION | INVERSION PULSE VAL-UE | FATSAT PULSE SE-LECTION | FATSAT PULSE VAL-UE | ... |
|---|---|---|---|---|---|---|---|---|---|---|---|---|---|---|---|---|
| HIGH CONTRAST | FASE | FASE+5 | PRESET | 1 | 32.0 | 1 | | 1 | | | | | | 1 | ON | ... |
| | | | PLAN DUPLICATOR | 1 | 32.0 | 1 | | 1 | 20 | 1 | 40 | 1 | OFF | 1 | ON | ... |
| | | FASE+10 | PRESET | 1 | 32.0 | 1 | 40 | | 20 | 1 | 40 | 1 | OFF | 1 | ON | ... |
| | | | PLAN DUPLICATOR | 1 | 10.0 | 1 | 40 | | | | | 1 | ON | 1 | ON | ... |
| | | | | 1 | 10.0 | 1 | 40 | | | | | 1 | ON | 1 | ON | ... |
| | | FSE | | | | | | | (OMITTED) | | | | | | | ... |
| | | FE | | | | | | | | | | | | | | ... |
| | | SE | | | | | | | | | | | | | | ... |
| HIGH RESOLUTION | FASE | | | | | | | | | | | | | | | ... |
| | FSE | | | | | | | | | | | | | | | ... |
| | FE | | | | | | | | | | | | | | | ... |
| | SE | | | | | | | | | | | | | | | ... |
| ... | | | | | | | | | | | | | | | | ... |

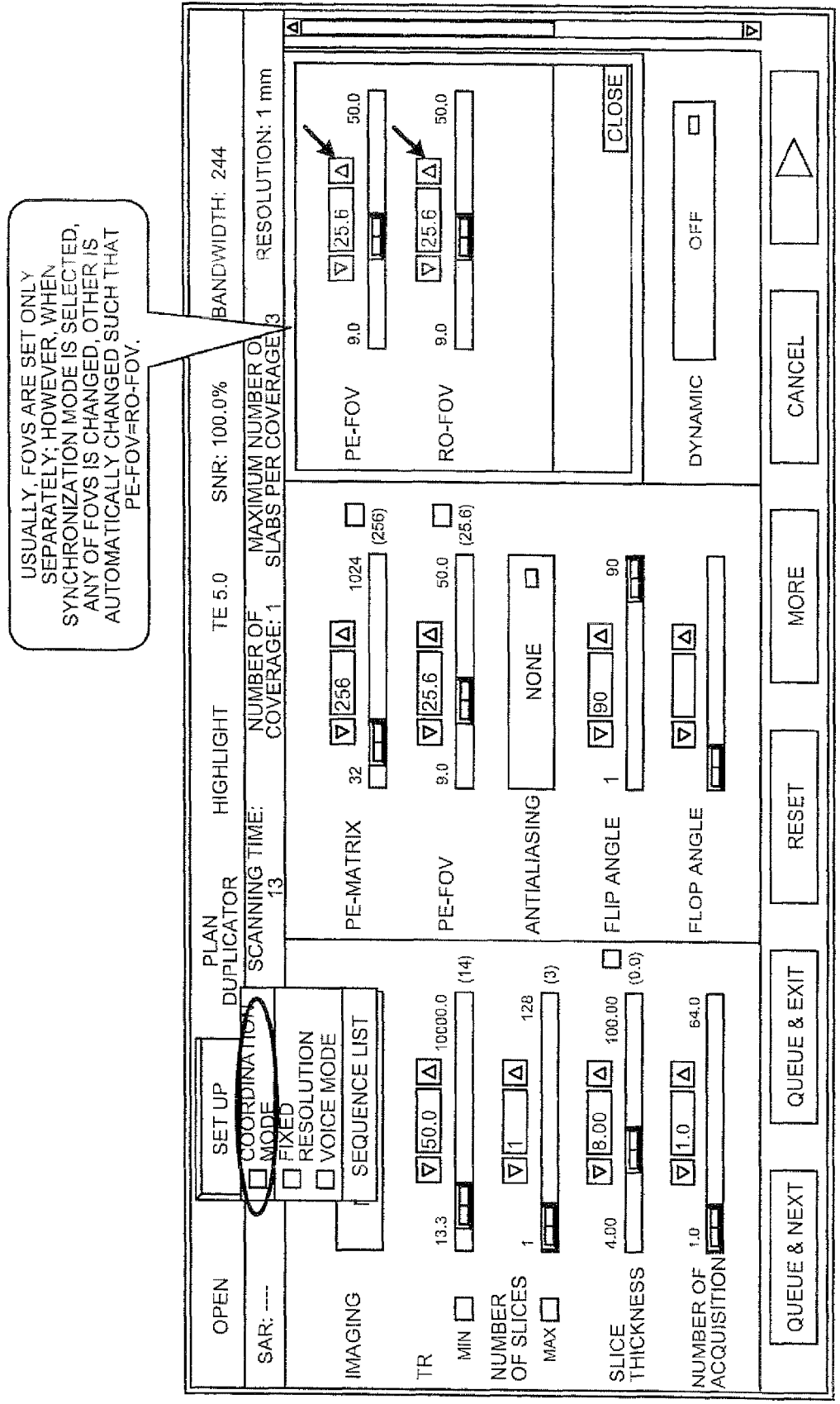

FIG.11

| SCAN ID | IN.TECH | HIGHLIGHT | TR | TE | PLANE | NS | ST | GAP | FOV | MTX | FA |
|---|---|---|---|---|---|---|---|---|---|---|---|
| LOCATOR AX/CO | FE 20 | WAIT | 40 | 5 | OTH: OTH | 9 | 8.0 | 2.0 | 25.0 | 128×256 | 40 |
| MAP | FE 20 | WAIT | 185 | 4 | AX: RL | 23 | 8.0 | 2.5 | 25.0 | 64 | 20 |
| LOCATOR SG | FSE(0) 20 | WAIT | 400 | 10 | SG: AP | 3 | 7.0 | 1.4 | 22.0 | 160×288 | 90/180 |
| MRA | MRA 30 | WAIT | 32 | 6.8 | AX: RL | 120 | 1.0 | — | 20.0 | 192×256 | 20 |
| T2 AX | FSE(13) 20 | WAIT | 4100 | 105 | AX: RL | 12 | 8.0 | 1.6 | 22.0 | 320×352 | 90/180 |
| T1 AX | SE 20 | WAIT | 400 | 12 | AX: RL | 12 | 8.0 | 1.6 | 22.0 | 320×384 | 90/180 |
| FLEIR | FSE(13) 20 | WAIT | 10000 | 105 | AX: RL | 12 | 8.0 | 1.6 | 22.0 | 320 | 90/180 |

OPEN | SET UP | PLAN DUPLICATOR | ENTRIES

SAR: ——  TE 5.0  SNR: 100.0%  BANDWIDTH: 244

IMAGING: MRA3D6.8FC_SLT

TR 13.3 / 50.0 / 100  MIN / MAX

NUMBER OF SLICES: 1 (3)

SLICE THICKNESS: 4.00 / 8.00 / 128 / 100.00

NUMBER OF ACQUISITION: 1.0 / 1.0 / 64.0 (0.0)

ANTIALIASING: NONE

FLIP ANGLE: 90

FLOP ANGLE: 1

DYNAMIC: OFF

QUEUE & NEXT | RESET | MORE | CANCEL | QUEUE & EXIT

ENTRIES
- ☐ BASIC PLAN    ☐ MATRIX
- ☐ SLAB          ☐ NO WRAP       ☐ FLIP ANG
- ☐ TR            ☐ SLICE THICKNESS ☐ FLOP ANG
- ☐ SLICE GAP     ☐ PRESATURATION
- ☒ FOV           ☐ LOCATOR IMAGE INFO.
- SAVE            CLOSE (DISPLAYING LIST OF SCANNING PROTOCOLS TO BE COPY SOURCE OF SCANNING PARAMETERS)

(PRELIMINARILY SELECTING SCANNING PARAMETERS TO BE COPIED)

MAGNETIC RESONANCE IMAGING APPARATUS AND SCANNING-CONDITION SETTING METHOD

CROSS-REFERENCE TO RELATED APPLICATIONS

This application is based upon and claims the benefit of priority from the prior Japanese Patent Application No. 2008-001632, filed on Jan. 8, 2008; the entire contents of which are incorporated herein by reference.

BACKGROUND OF THE INVENTION

1. Field of the Invention

The present invention relates to a magnetic resonance imaging apparatus and a scanning-condition setting method for reconstructing an image by irradiating a subject with a Radio Frequency (RF) wave based on scanning conditions including a plurality of scanning parameters, and detecting a magnetic resonance signal generated from the subject in accordance with the RF wave. Particularly the present invention relates to setting of scanning conditions to be carried out for a scan.

2. Description of the Related Art

Conventionally, a magnetic resonance imaging apparatus collects data indicating the inside of the body of a subject by using a magnetic resonance phenomenon based on scanning conditions specified by an operator, and reconstructs an image from the collected data. The scanning conditions specified by the operator include a number of scanning parameters, for example, a repetition time (TR), an echo time (TE), the number of slices, a slice thickness, and a Field Of View (FOV).

The variety of those scanning parameters is quite wide (sometimes, there are approximately 700 parameters in some cases), and not a few parameters are dependent on one another such that the parameter value of one scanning parameter is restricted by the parameter value of another scanning parameter. For this reason, a conventional magnetic resonance imaging apparatus requires enormous efforts for setting scanning conditions, and various technologies for facilitating setting of scanning conditions have been invented.

For example, JP-A 2006-255189 (KOKAI) discloses a technology according to which an order of precedence of scanning parameters are set in advance; then after the parameter value of a scanning parameter of the highest priority is input, allowable ranges of parameter values of the other scanning parameters are calculated not to change the input parameter value; and an operator sets parameter values within the calculated allowable ranges, so that the operator efficiently sets scanning conditions while checking a dependence relationship between the scanning parameters.

The technology is effective when setting scanning parameters one by one. However, because the variety of scanning parameters used by a magnetic resonance imaging apparatus is considerably wide as described above, there are user demands for simultaneously setting a plurality of scanning parameters.

To respond to the demands, conventionally a technology for simultaneously setting a plurality of scanning parameters has been also invented. FIGS. 10 and 11 are schematic diagrams for explaining an example of a conventional technology for simultaneously setting a plurality of scanning parameters.

For example, as shown in FIG. 10, there is a technology according to which when a "coordination mode" is selected in advance by an operator on a scanning-condition setting screen for setting scanning parameters, upon changing the parameter value of a specific parameter that is usually often set, the parameter value of another relevant scanning parameter is automatically changed. According to the example in the figure, when the parameter value of "PE-FOV" is changed, the parameter value of "RO-FOV" that is relevant to "PE-FOV" is automatically changed to the same value as that of "PE-FOV".

Alternatively, as shown in FIG. 11, there is a technology according to which when "plan duplicator" is selected by the operator on the same scanning-condition setting screen as that in FIG. 10, a list of scanning protocols that are already set (the list of "Locator AX/CO" to "FLEIR AX" shown in the figure) is displayed, and a parameter value of a scanning parameter is copied from scanning conditions of a scanning protocol selected from the list, and set as a new scanning condition. A scanning parameter to be copied is selected in advance by the operator from among specific scanning parameters displayed on a certain screen (for example, a screen shown in the lower part of the figure).

However, when setting scanning conditions as described above, there is a demand for simultaneously setting arbitrarily selected scanning parameters, for example, in accordance with a scan aim, not limited to specific scanning parameters (for example, "PE-FOV" and "RO-FOV"). According to the conventional technologies described above, to respond to the demand, there is a problem such that a unit for setting scanning conditions is each scanning parameter, or even when a plurality of scanning parameters can be simultaneously set, scanning parameters that can be set are limited to specific parameters, so that arbitrarily selected scanning parameters cannot be simultaneously set.

SUMMARY OF THE INVENTION

According to one aspect of the present invention, a magnetic resonance imaging apparatus includes a preset-information storage unit that stores information for each group as preset information, the information including in a grouped manner a part of scanning parameters included in a plurality of scanning parameters required for a scan; a preset-information selecting unit that selects at least one set of preset information from among the preset information stored in the preset-information storage unit, based on an instruction from an operator; a scanning-condition setting unit that sets parameter values with respect to scanning parameters that are grouped in the preset information selected by the preset-information selecting unit; a data collecting unit that collects data indicating an inside of a body of a subject in accordance with scanning conditions including the parameter values set by the scanning-condition setting unit; and an image reconstructing unit that reconstructs an image from the data collected by the data collecting unit.

According to another aspect of the present invention, a scanning-condition setting method includes storing information in a storage device for each group as preset information, the information including in a grouped manner a part of scanning parameters included in a plurality of scanning parameters required for a scan; electing at least one set of preset information from among the preset information stored in the storage device based on an instruction from an operator; setting parameter values with respect to scanning parameters that are grouped in the selected preset information; collecting data indicating an inside of a body of a subject in accordance with scanning conditions including the set parameter values; and reconstructing an image from the collected data.

BRIEF DESCRIPTION OF THE DRAWINGS

FIG. 2 is a functional block diagram of a configuration of a console device shown in FIG. 1;

FIG. 3 is a schematic diagram illustrating an example of preset information stored by a preset-information storage unit shown in FIG. 2;

FIG. 10 is a schematic diagram (1) for explaining an example of a conventional technology for simultaneously setting a plurality of scanning parameters; and FIG. 11 is a schematic diagram (2) for explaining another example of the conventional technology for simultaneously setting a plurality of scanning parameters.

DETAILED DESCRIPTION OF THE INVENTION

Exemplary embodiments of a magnetic resonance imaging apparatus and a scanning-condition setting method according to the present invention will be explained below in detail with reference to the accompanying drawings. Hereinafter, a magnetic resonance imaging apparatus is referred to as an MRI apparatus, and a magnetic resonance imaging signal generated from a subject is referred to as an MR signal.

An MRI apparatus according to an embodiment of the present invention has main features configured to store therein preset information including a plurality of scanning parameters that are grouped based on an instruction from an operator, and to set scanning conditions based on the grouped scanning parameters in the preset information. Because of the features, the MRI apparatus according to the embodiment is configured to be capable not only to set a specific parameter, but also to set simultaneously a plurality of scanning parameters that is arbitrarily selected. A configuration of the MRI apparatus and a process procedure performed by the MRI apparatus are explained below in order.

Figure 1:
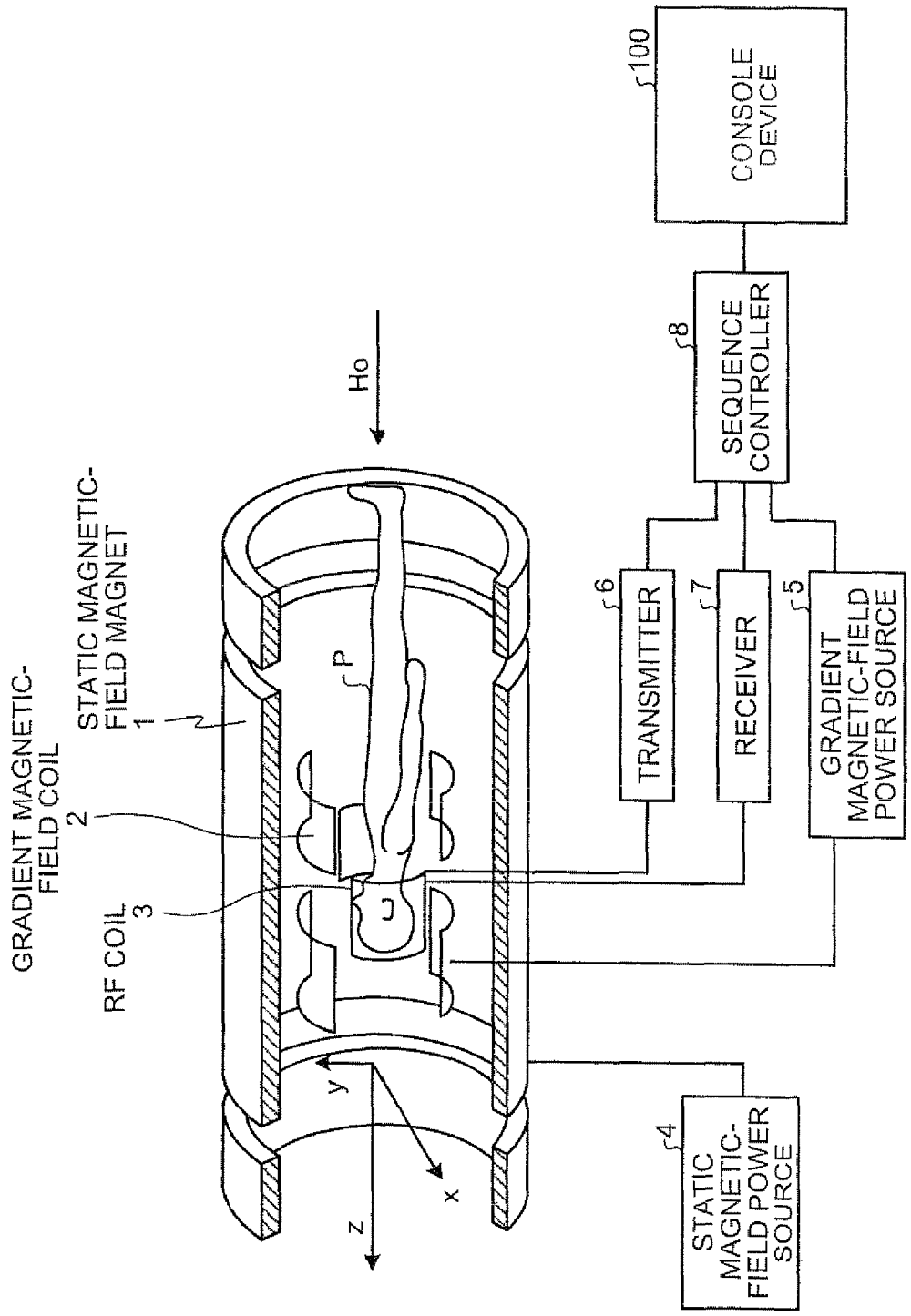
FIG. 1 is a schematic diagram illustrating a general configuration of a Magnetic Resonance Imaging (MRI) apparatus according to an embodiment of the present invention.

A general configuration of an MRI apparatus according to an embodiment of the present invention is explained below with reference to FIG. 1. FIG. 1 is a general configuration of the MRI apparatus according to the embodiment. As shown in the figure, the MRI apparatus includes a static magnetic-field magnet 1, gradient magnetic-field coils 2, an RF coil 3, a static magnetic-field power source 4, a gradient magnetic-field power source 5, a transmitter 6, a receiver 7, a sequence controller 8, and a console device 100.

The static magnetic-field magnet 1 is a magnet formed in a cylindrical shape, and generates a static magnetic field $H_0$ in a space inside a cylinder in which a subject P is placed using a current supplied from the static magnetic-field power source 4. The gradient magnetic-field coils 2 are three pairs of coils arranged inside the static magnetic-field magnet 1, and generate a gradient magnetic field of which strength linearly changes along three directions of the x, y, and z axes, which are orthogonal to one another inside the static magnetic-field magnet 1, using a current supplied from the gradient magnetic-field power source 5.

The RF coil 3 is a coil arranged to be opposed to the subject P inside an opening of the static magnetic-field magnet 1, irradiates the subject P with an RF pulse sent from the transmitter 6, and receives an MR signal emitted from hydrogen nuclei in the subject P owing to excitation. The static magnetic-field power source 4 supplies a current to the static magnetic-field magnet 1, and the gradient magnetic-field power source 5 supplies a current to the gradient magnetic-field coil 2 based on an instruction from the sequence controller 8.

The transmitter 6 sends an RF pulse to the RF coil 3 based on an instruction from the sequence controller 8. The receiver 7 detects an MR signal received by the RF coil 3, and sends raw data obtained by digitalizing the detected MR signal to the sequence controller 8.

The sequence controller 8 performs scanning of the subject P by activating the gradient magnetic-field power source 5, the transmitter 6, and the receiver 7, based on sequence information sent from the console device 100. As a result of performing a scan of the subject P, when raw data is sent from the receiver 7, the sequence controller 8 sends the raw data to the console device 100.

The sequence information defines a procedure when scanning, such as the strength of power to be supplied to the gradient magnetic-field coil 2 by the gradient magnetic-field power source 5 and the timing of supplying the power, the strength of an RF pulse to be sent to the RF coil 3 by the transmitter 6 and the timing of sending the RE pulse, and the timing of detecting the MR signal by the receiver 7.

The console device 100 receives each of various instructions from the operator, controls the whole of the MRI apparatus based on the received instruction, and reconstructs an image of the subject based on the raw data sent from the sequence controller 8. A configuration of the console device 100 will be explained later in detail.

The MRI apparatus also includes a gantry that has the static magnetic-field magnet 1, the gradient magnetic-field coil 2, the RF coil 3, and the like, a top plate on which the subject P is to be placed and a patient couch that moves the top plate to in/out of the gantry, although those are not shown.

A configuration of the console device 100 shown in FIG. 1 is explained below with reference to FIG. 2. FIG. 2 is a functional block diagram of the configuration of the console device 100 shown in FIG. 1. As shown in the figure, the console device 100 includes an input unit 110, a display unit 120, a storage unit 130, and a control unit 140.

The input unit 110 receives various inputs from the operator, can be implemented by pointing devices, such as a mouse or a trackball, and a keyboard, and provides the operator with a user interface configured to receive various operations by cooperating with the display unit 120.

The display unit 120 is an output unit that displays thereon various information, such as a scan image, and can be implemented by a monitor device, such as a Cathode Ray Tube (CRT) display, or a liquid crystal display. The display unit 120 displays thereon various messages to the operator, and a reconstructed image of a subject reconstructed by an image reconstructing unit 143, which will be described later, under the control of a main control unit 141, which will be described later.

The storage unit 130 stores therein various information, and includes an image storage unit 131, a preset-information storage unit 132, a dependence-information storage unit 133, and a scanning-condition information storage unit 134. The image storage unit 131 stores therein a reconstructed image reconstructed by the image reconstructing unit 143.

The preset-information storage unit 132 stores therein preset information including scanning parameters that are grouped based on an instruction from the operator. FIG. 3 is a schematic diagram that depicts an example of preset information stored by the preset-information storage unit 132. The preset information stored by the preset-information storage unit 132 is set by the operator by using a preset-information setting screen, which will be described later, in accordance with a scan aim and a scanning method.

Specifically, as shown in the figure, the preset-information storage unit 132 stores therein information that a "preset name" that represents a scan aim, a "sequence category" that represents a category of a scanning method, a "sequence" that represents a type of the scanning method, and a "preset type" that represents a type of preset information are associated with scanning parameters, such as a "repetition time (TR)" and an "echo time (TE)", an "imaging flip angle", an "imaging flop angle", an "inversion pulse", and "fats at pulse", as preset information.

For example, as shown in the figure, information that indicates a scan aim, such as "high contrast" or "high resolution", is set in the preset name. Information that indicates a category of a scanning method, such as "Fast Advanced Spin Echo (FASE)", "Field Echo (FE)", or "Spin Echo (SE)", is set in the sequence category in accordance with a scan aim.

Information that indicates a scanning method, such as "FASE+5" or "FASE+10", is set in the sequence in accordance with a sequence category. Information indicating a use of the preset information, such as "preset" and "plan duplicator", is set in the preset type. When the main control unit 141, which will be described later, refers to the preset information, the preset type is to be used in accordance with a use of the preset information.

Each of the scanning parameters includes a selection flag ("selection" shown in the figure), and a parameter value ("value" shown in the figure). In this case, scanning parameters of which selection flag is "1" among a set of preset information indicate that those are grouped.

In this way, the preset information is information including in a grouped manner a part of scanning parameters included in a plurality of scanning parameters required for a scan;

Although information indicating a scan aim is set in the preset name in the case explained here, the present invention is not limited to this. For example, not only information indicating a scan aim, but arbitrary information can be set by the operator. In such case, the operator can set various identification information in the preset name, for example, a name of an operator who registers the preset information, a name of a group to which the operator belongs, and date and time at which the preset information is registered. Accordingly, the operator can efficiently manage the preset information depending on a use and an aim, for example.

The dependence-information storage unit 133 stores therein dependence information that indicates a dependence relationship between scanning parameters. Specifically, the dependence-information storage unit 133 stores therein information including a dependence function that defines dependence of each parameter on one or more other scanning parameters, as dependence information.

The dependence function is a function for calculating an allowable range of a scanning parameter based on relation with other scanning parameters, so that the adequacy of a set scanning parameter can be checked by calculating the allowable range of the scanning parameter by using the dependence function. The dependence information including such dependence function is created, for example, by a developer of the MRI apparatus, at the time of development, and preliminarily registered in the dependence-information storage unit 133.

The scanning-condition information storage unit 134 stores therein scanning-condition information that indicates scanning conditions with respect to each scanning protocol that is already set. Specifically, the scanning-condition information storage unit 134 stores therein scanning-condition information that information indicating a scanning protocol is associated with a plurality of scanning parameters to be scanning conditions, with respect to each scanning protocol. The scanning conditions stored by the scanning-condition information storage unit 134 are registered by the operator by using a scanning-condition setting screen, which will be described later.

The control unit 140 includes a control program, such as an Operating System (OS), computer programs that specify various processing procedures, and an internal memory that stores therein relevant data, and executes various processing by using the programs and the memory.

Specifically, the control unit 140 includes the main control unit 141, a sequence control unit 142, the image reconstructing unit 143, a preset-information setting unit 144, and a scanning-condition setting unit 145.

The main control unit 141 receives input of various information from the operator via the input unit 110, and controls operations of functional units based on the received information. The main control unit 141 receives input from the operator by using, for example, "a preset-information setting screen" for selecting scanning parameters to be grouped from among scanning parameters, or "a scanning-condition setting screen" for inputting information about scanning conditions. These two screens are explained below in detail.

Figure 4:
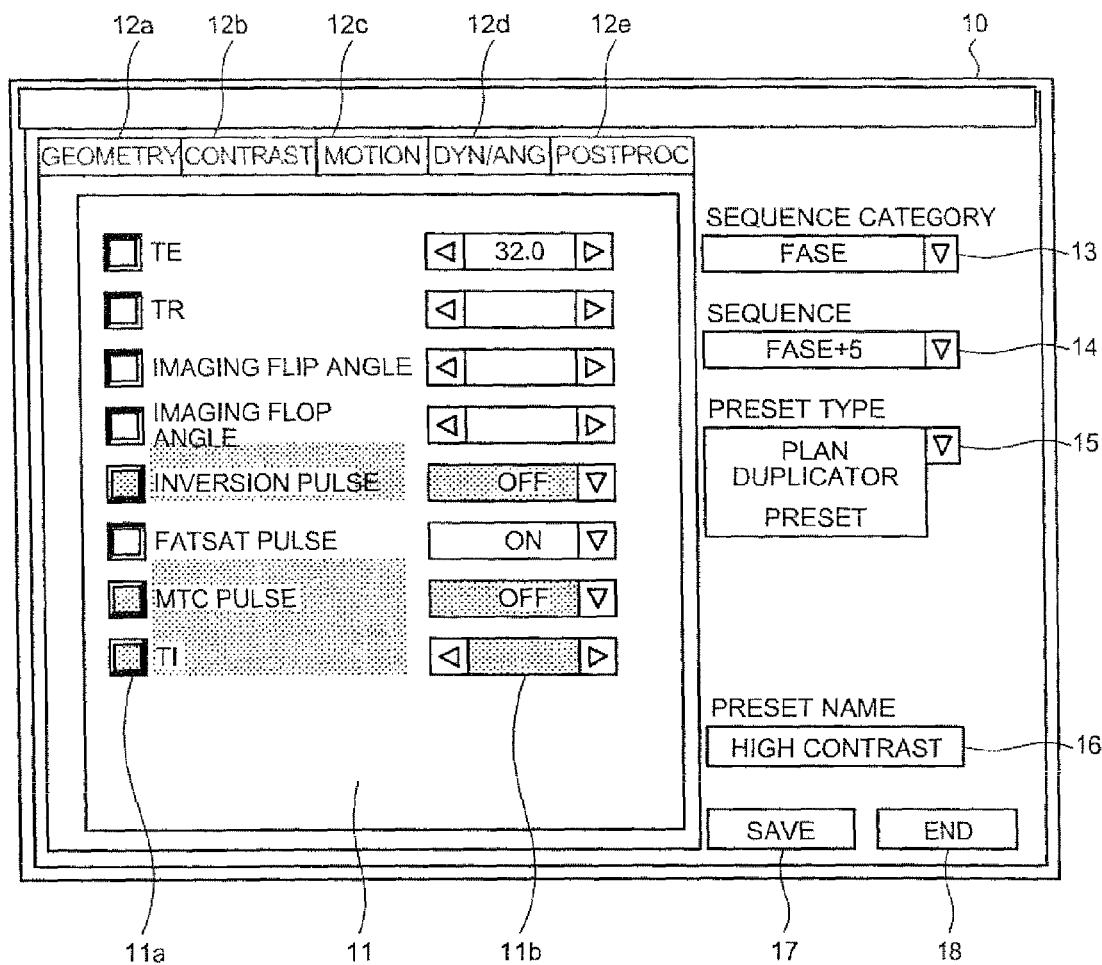
FIG. 4 is a schematic diagram illustrating an example of a preset-information setting screen according to the embodiment.

At first, the preset-information setting screen is explained below. FIG. 4 is a schematic diagram that depicts an example of the preset-information setting screen. For example, in response to a display request from an operator, the main control unit 141 displays on the display unit 120 a preset-information setting screen 10, which includes, as shown in the figure, a scanning-parameter input area 11, tabs 12a to 12e, a sequence-category input pull-down 13, a sequence input pull-down 14, a preset-type input pull-down 15, a preset-name input box 16, a save button 17, and an end button 18.

By using the preset-information setting screen 10, the operator can group scanning parameters in accordance with a scan aim and a scanning method, and can register preset information including the grouped scanning parameters.

The scanning-parameter input area 11 is an area for selecting scanning parameters to be grouped, and setting a parameter value of each scanning parameter. The scanning-parameter input area 11 is prepared for each category of scanning parameters, and a checkbox 11a and a parameter-value input box 11b are displayed with respect to each scanning parameter in the scanning-parameter input area 11 of each category. By selecting scanning parameters in the scanning-parameter input area 11, the operator can group scanning parameters arbitrarily.

The tabs 12a to 12e are provided for switching display of the scanning-parameter input area 11, and prepared for respective categories of scanning parameters. By selecting one of the tabs 12a to 12e, the operator can select scanning parameters and can set parameter values with respect to each category of the scanning parameters.

The sequence-category input pull-down 13 is a pull-down menu for inputting information indicating a category of a scanning method. By using the sequence-category input pull-down 13, the operator can select one scanning method from among a plurality of predefined categories of scanning methods, and can associate the selected category of scanning methods with each scanning parameter grouped in the scanning-parameter input area 11 (scanning parameter of which the checkbox 11a is checked).

The sequence input pull-down 14 is a pull-down menu for inputting information indicating a type of a scanning method. By using the sequence input pull-down 14, the operator can select one scanning method from among a plurality of predefined scanning methods, and can associate the selected scanning method with each scanning parameter grouped in the scanning-parameter input area 11 (scanning parameter of which the checkbox 11a is checked).

The preset-type input pull-down 15 is a pull-down menu for inputting information indicating a use of preset information. By using the preset-type input pull-down 15, the operator can select one preset type from among predefined preset types, and can associated with the selected preset type with each scanning parameter grouped in the scanning-parameter input area 11 (scanning parameter of which the checkbox 11a is checked).

The preset-name input box 16 is a box for inputting information indicating a scan aim. By using the preset-name input box 16, the operator can input a preset name of an arbitrary name, and can associate the input preset name with each scanning parameter grouped in the scanning-parameter input area 11 (scanning parameter of which the checkbox 11a is checked).

The save button 17 is a button for receiving from the operator an instruction to register information input from the preset-information setting screen 10 as preset information. The end button 18 is a button for receiving from the operator an instruction to close the preset-information setting screen 10.

The preset-information setting screen 10 has been explained above. The information that is input by using the preset-information setting screen 10 is sent to the preset-information setting unit 144, which will be described later, in the timing when the operator presses the save button 17; a dependence relationship between the scanning parameters in the sent information is checked by the preset-information setting unit 144; and then the information is registered into the preset-information storage unit 132 as preset information.

Figure 5:
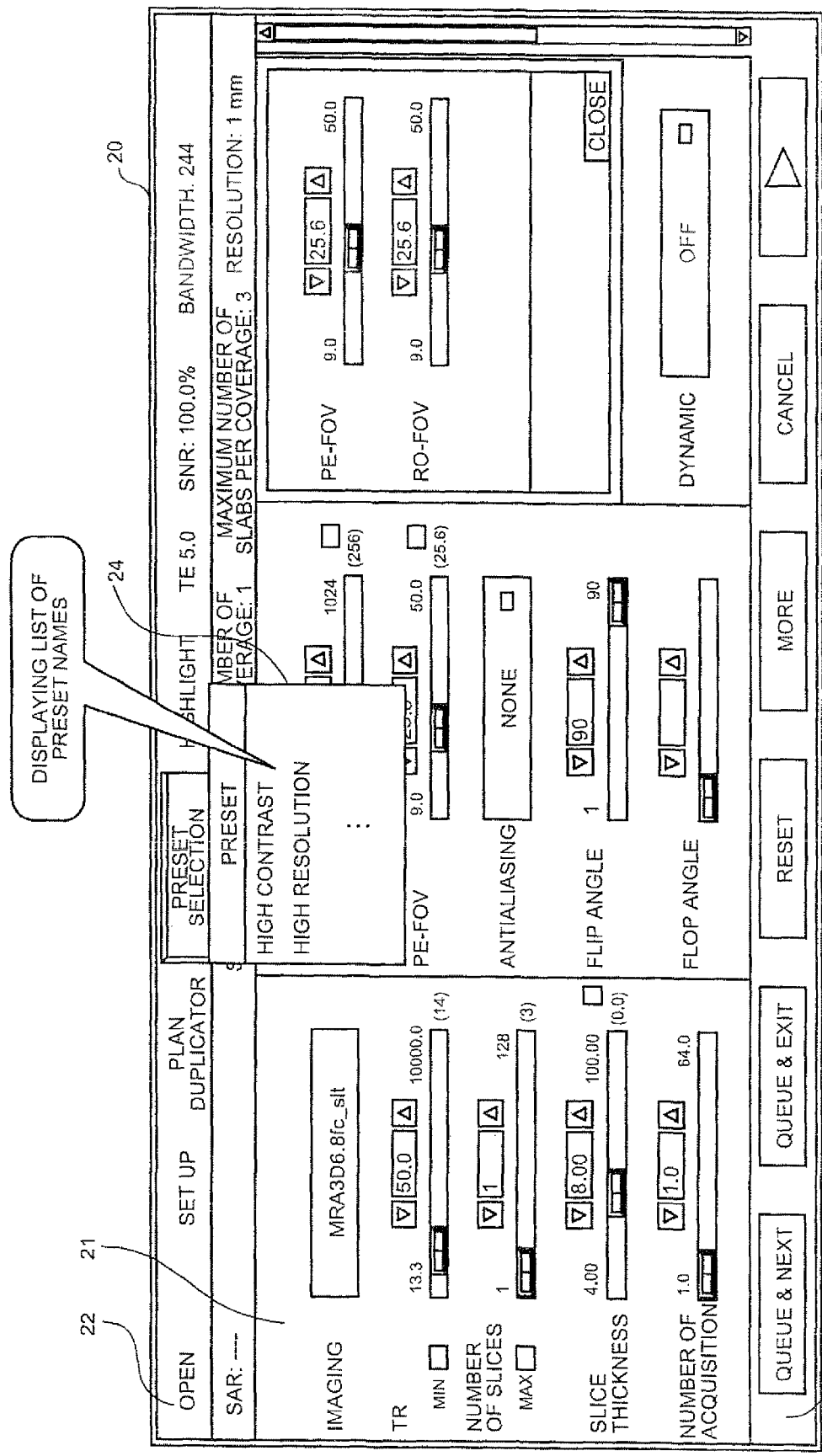
FIG. 5 is a schematic diagram (1) illustrating an example of a scanning-condition setting screen according to the embodiment.
Figure 6:
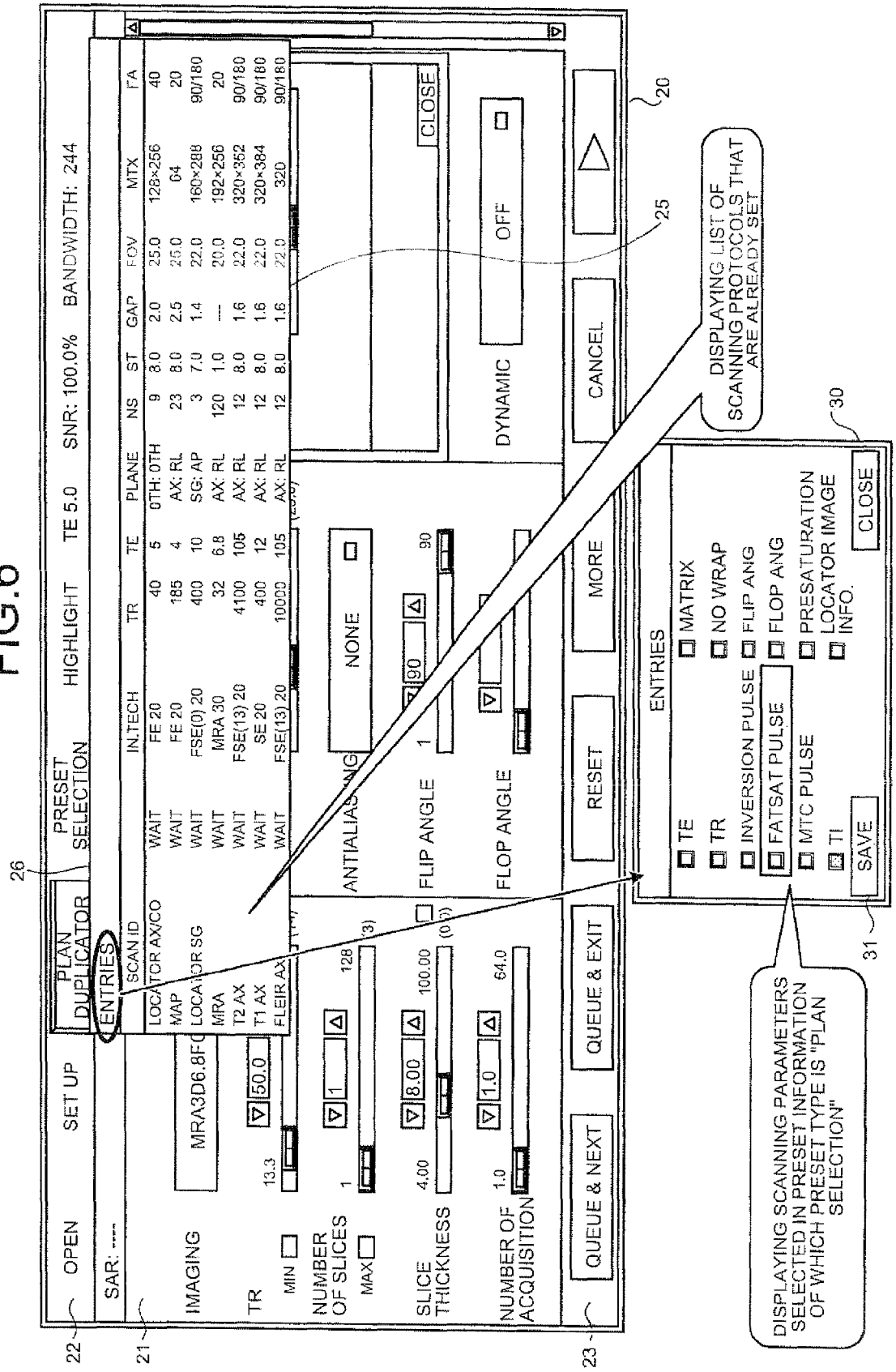
FIG. 6 is a schematic diagram (2) illustrating another example of the scanning-condition setting screen according to the embodiment.

Then, the scanning-condition setting screen is explained below FIGS. 5 and 6 are schematic diagrams that depict an example of the scanning-condition screen. For example, in response to a display request from an operator, the main control unit 141 displays on the display unit 120 a scanning-condition setting screen 20, which includes, as shown in FIG. 5, a scanning-condition setting area 21 in which boxes for inputting various scanning parameters and their parameter values are displayed, a menu bar 22 on which various menus are displayed, and an operation bar 23 on which various operation buttons are displayed.

The operator inputs information about scanning conditions by using the scanning-condition setting screen 20. When inputting, the operator can simultaneously set a plurality of scanning parameters in accordance with a scan aim by using preliminarily registered preset information by selecting "preset selection" included in the menu bar 22, or can copy a plurality of scanning parameters from scanning conditions of a scanning protocol that are already set by selecting "plan duplicator", and can simultaneously set the copied scanning parameters.

When the operator selects the "preset selection", the main control unit 141 refers to the preset information stored by the preset-information storage unit 132, and extracts preset information of which preset type is "preset". The main control unit 141 then creates a list 24 of preset names based on the extracted preset information, and displays the created list 24 on the scanning-condition setting screen 20 (see FIG. 5).

At the time of the above process, if scanning parameters indicating a sequence category and a sequence are input on the scanning-condition setting screen 20; when extracting preset information, the main control unit 141 creates and displays the list 24 of preset names after narrowing the preset information based on the sequence category and the sequence that are input.

When the operator selects one of the preset names displayed in the list 24, the main control unit 141 acquires preset information corresponding to the selected preset name from the preset-information storage unit 132, and sends scanning parameters included in the acquired preset information to the scanning-condition setting unit 145, which will be described later. The scanning-condition setting unit 145 checks a dependence relationship between the scanning parameters sent to the scanning-condition setting unit 145 and other scanning parameters. If an error is found in any dependence relationship, a scanning parameter causing the error is notified from the scanning-condition setting unit 145.

When the scanning parameter causing the error is notified, the main control unit 141 displays the scanning parameter on the scanning-condition setting screen 20. When the operator then corrects the scanning parameter causing the error, the main control unit 141 sends the corrected scanning parameter to the scanning-condition setting unit 145, and tries to check a dependence relationship again.

The main control unit 141 repeats the check on a dependence relationship until it is notified from the scanning-condition setting unit 145 that there is no error in a dependence relationship. When it is notified from the scanning-condition setting unit 145 that there is no error in a dependence relationship, the main control unit 141 displays all scanning parameters including corrected scanning parameters in the scanning-condition setting area 21 on the scanning-condition setting screen 20.

After that, when the operator presses a "queue & exit" button on the operation bar, the main control unit 141 sends the scanning parameters displayed on the scanning-condition setting screen 20 to the scanning-condition setting unit 145, and instructs the scanning-condition setting unit 145 to register scanning-condition information based on the scanning parameters.

On the other hand, when the operator selects the "plan duplicator", the main control unit 141 acquires scanning-condition information stored by the scanning-condition information storage unit 134, creates a list 25 of scanning protocols that are already set, and displays the list 25 on the scanning-condition setting screen 20 (list of "Locator AX/CO" to "FLEIR AX" shown in FIG. 6). When displaying, the main control unit 141 also displays a scanning-parameter entries button 26 together with the list 25 of scanning protocols.

When the operator presses the scanning-parameter entries button 26, the main control unit 141 refers to the preset information stored by the preset-information setting unit 144, and specifies and extracts preset information of which preset type is "plan duplicator", sequence category and sequence correspond to a sequence category and a sequence input on the scanning-condition setting screen 20, and selection flag is "1".

The main control unit 141 then creates a scanning-parameter selection screen 30 on which a check box associated with each scanning parameter and a name of each scanning parameter are displayed, with respect to each of scanning parameters included in the extracted preset information, and displays the scanning-parameter selection screen 30 on the display unit 120 (see the lower part of FIG. 6). The scanning parameters displayed on the scanning-parameter selection screen 30 are configured to be changed in accordance with a combination of scanning parameters grouped in preset information.

When displaying, the main control unit 141 displays the scanning-parameter selection screen 30 in a state where all of the check boxes associated with respective scanning parameters are checked, and also allows the operator to uncheck any check box as required.

When the operator presses a save button 31, the main control unit 141 saves scanning parameters of which check boxes are checked at the moment, for example, into an internal memory, and then closes the scanning-parameter selection screen 30.

After that, when the operator selects any scanning parameter from the list 25 of scanning protocols displayed on the scanning-condition setting screen 20, the main control unit 141 acquires scanning-condition information corresponding to the selected scanning protocol from the scanning-condition information stored by the scanning-condition information storage unit 134.

The main control unit 141 then copies scanning parameters matching with the scanning parameters saved in the internal memory from among scanning parameters included in the acquired scanning-condition information, and sends the copied scanning parameters to the scanning-condition setting unit 145, which will be described later. The scanning-condition setting unit 145 checks a dependence relationship between the scanning parameters sent to the scanning-condition setting unit 145 and other scanning parameters. If an error is found in any dependence relationship, a scanning parameter causing the error is notified from the scanning-condition setting unit 145.

When the scanning parameter causing the error is notified, the main control unit 141 displays the scanning parameter on the scanning-condition setting screen 20. When the operator then corrects the scanning parameter causing the error, the main control unit 141 sends the corrected scanning parameter to the scanning-condition setting unit 145, and tries to check a dependence relationship again.

The main control unit 141 repeats the check on a dependence relationship until it is notified from the scanning-condition setting unit 145 that there is no error in a dependence relationship. When it is notified from the scanning-condition setting unit 145 that there is no error in dependence, the main control unit 141 displays all scanning parameters including corrected scanning parameters in the scanning-condition setting area 21 on the scanning-condition setting screen 20.

After that, when the operator presses the "queue & exit" button on the operation bar, the main control unit 141 sends the scanning parameters displayed on the scanning-condition setting screen 20 to the scanning-condition setting unit 145, and instructs the scanning-condition setting unit 145 to register scanning-condition information based on the scanning parameters.

As described above, the main control unit 141 copies parameter values from among scanning parameters of scanning protocols that are already set, and displays the copied parameter values in the scanning-condition setting area 21 on the scanning-condition setting screen 20 in this case. However, for example, with respect to scanning parameters of which parameter values are set in preset information, the main control unit 141 can copy parameter values from the scanning parameters in the preset information instead of the scanning parameters of the scanning protocols that are already set.

After scanning parameters are registered in this way, when receiving a scan instruction from the operator, the main control unit 141 acquires scanning-condition information of the instructed scanning protocol from the scanning-condition information storage unit 134, creates sequence information based on the acquired scanning conditions, and sends the created sequence information to the sequence control unit 142. The sequence information is sent to the sequence controller 8 via the sequence control unit 142. Accordingly, the sequence controller 8 performs a scan of the subject P.

The sequence control unit 142 controls transmission and reception of data exchanged with the sequence controller 8. Specifically, when the sequence information is sent from the main control unit 141, the sequence control unit 142 sends the sequence information to the sequence controller 8. When raw data is then sent from the sequence controller 8, the sequence control unit 142 delivers the sent raw data to the image reconstructing unit 143.

The image reconstructing unit 143 reconstructs an image based on the raw data to be delivered from the sequence control unit 142. Specifically, the image reconstructing unit 143 converts the raw data to be delivered from the sequence control unit 142 into k-space data under the control of the main control unit 141, and reconstructs a two-dimensional image or a three-dimensional image by performing certain image-reconstruction processing, such as a Fourier transformation, on the k-space data.

The preset-information setting unit 144 registers preset information including scanning parameters grouped by the operator into the preset-information storage unit 132.

Specifically, when the save button 17 is pressed on the preset-information setting screen 10, and information including a preset name, a sequence category, a sequence, a preset type, and a group of scanning parameters is sent from the main control unit 141; the preset-information setting unit 144 acquires dependence information corresponding to the sent scanning parameters from the dependence information stored by the dependence-information storage unit 133.

Subsequently, the preset-information setting unit 144 calculates an allowable range with respect to each of the sent scanning parameters based on a dependence function included in the acquired dependence information, and detects whether the parameter value of each scanning parameter falls within the calculated allowable range.

If the parameter value of any scanning parameter does not fall within the allowable range, the preset-information setting unit 144 notifies the operator via the main control unit 141 that an error occurs in a dependence relationship between the scanning parameter and another scanning parameter. Accordingly, a correction of the scanning parameter can be suggested to the operator. On the other hand, if the parameter values of all of the scanning parameters fall within respective allowable ranges, the preset-information setting unit 144 creates preset information that includes the scanning parameters, and stores the preset information in the preset-information storage unit 132.

The scanning-condition setting unit 145 sets scanning conditions based on scanning parameters grouped in the preset information stored by the preset-information storage unit 132.

Specifically, when scanning parameters are sent from the main control unit 141, the scanning-condition setting unit 145 acquires dependence information corresponding to the sent scanning parameters from among the dependence information stored in the dependence-information storage unit 133. Subsequently, the scanning-condition setting unit 145 calculates an allowable range with respect to each of the sent scanning parameters based on a dependence function included in the acquired dependence information, and detects whether the parameter value of each scanning parameter falls within the calculated allowable range.

If the parameter value of any scanning parameter does not fall within the allowable range, the scanning-condition setting unit 145 notifies the main control unit 141 that an error occurs in a dependence relationship between the scanning parameter and another scanning parameter. On the other hand, if the parameter values of all of the scanning parameters fall within respective allowable ranges, the scanning-condition setting unit 145 notifies the main control unit 141 that there is no error in a dependence relationship.

Moreover, when the main control unit 141 instructs the scanning-condition setting unit 145 to register scanning-condition information, the scanning-condition setting unit 145 creates scanning-condition information based on scanning parameters sent together with the instruction, and stores the created scanning-condition information in the scanning-condition information storage unit 134.

Figure 7:
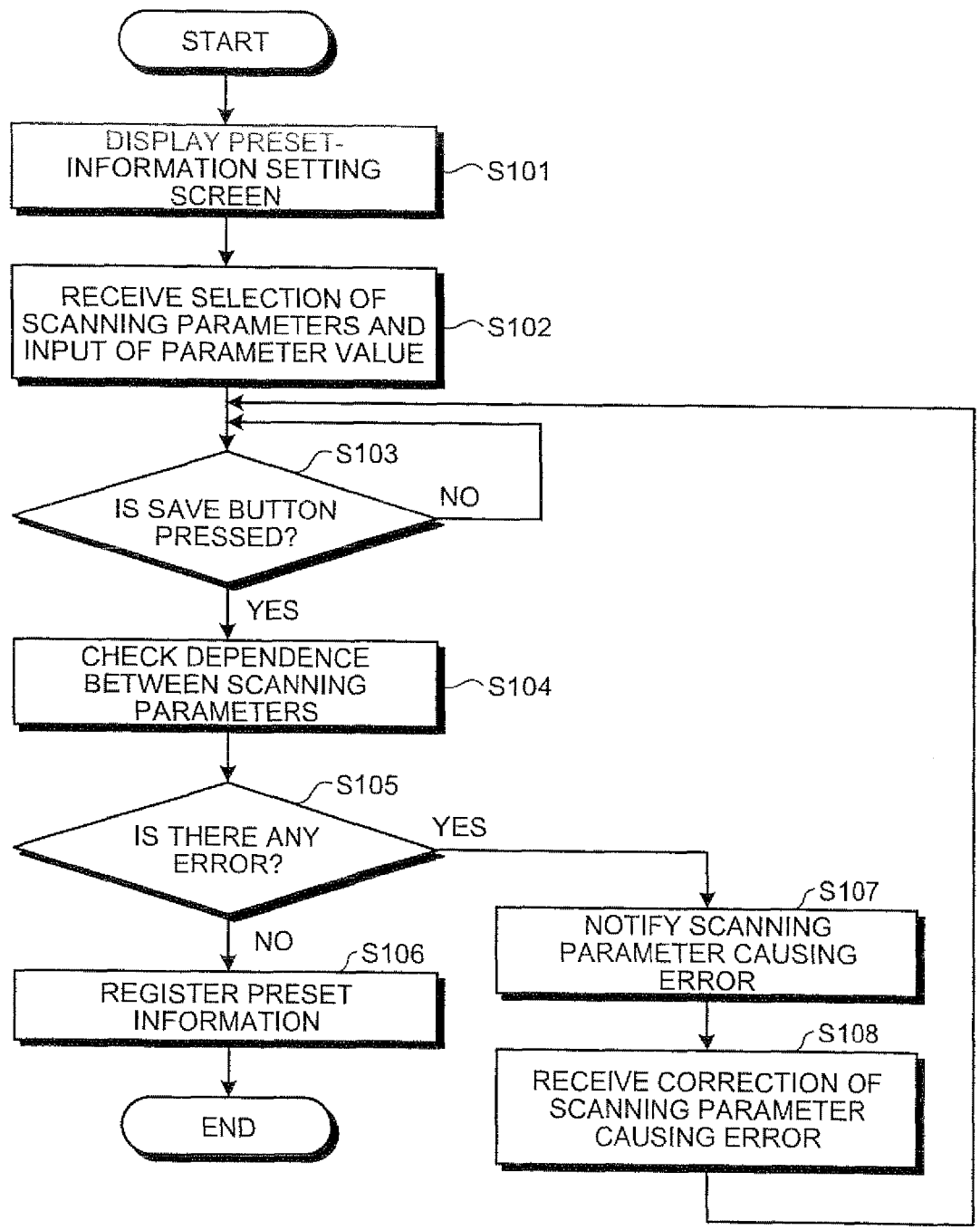
FIG. 7 is a flowchart of a process procedure of preset-information setting according to the embodiment.
Figure 8:
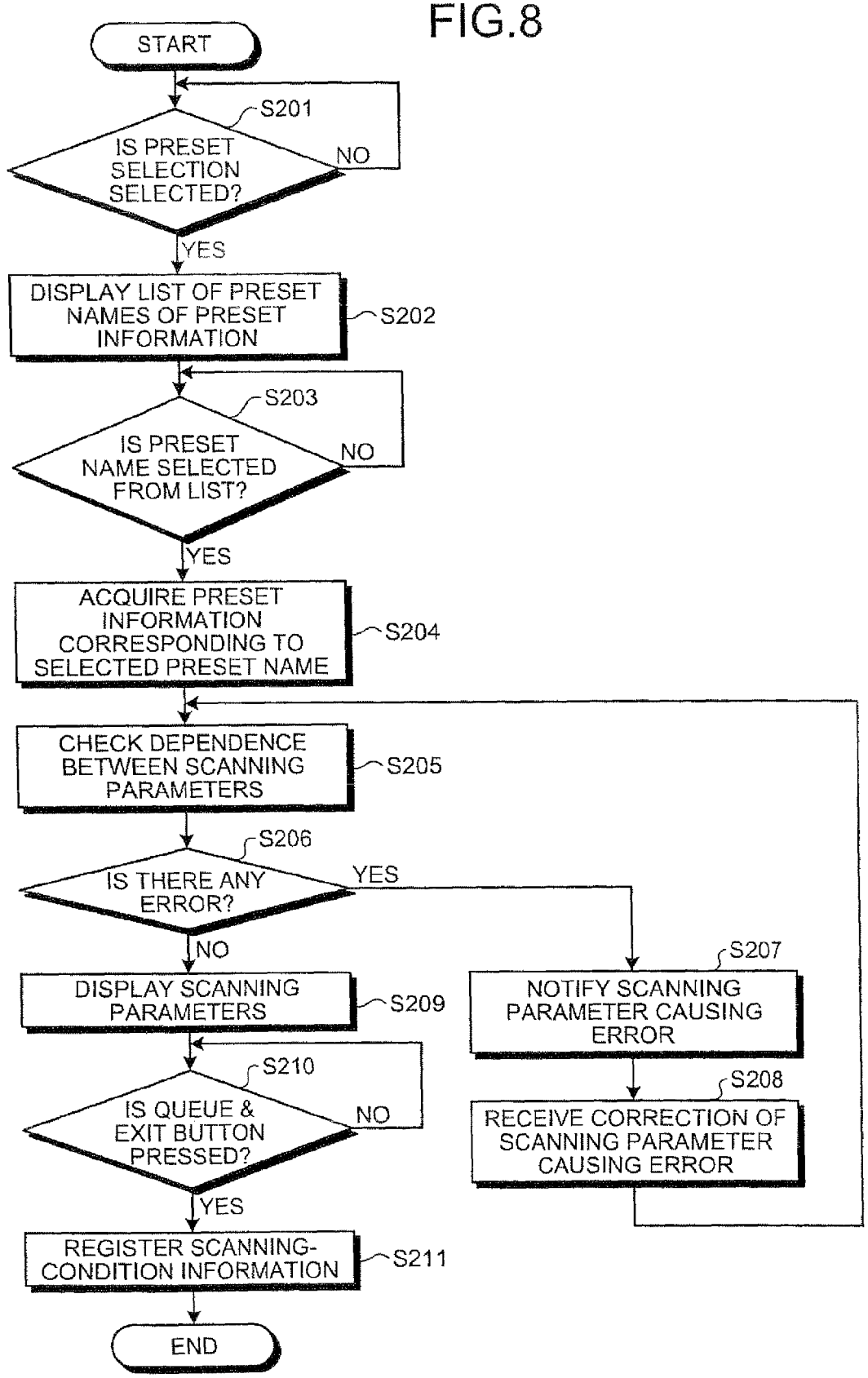
FIG. 8 is a flowchart of a process procedure of scanning-condition setting by preset selection according to the embodiment.
Figure 9:
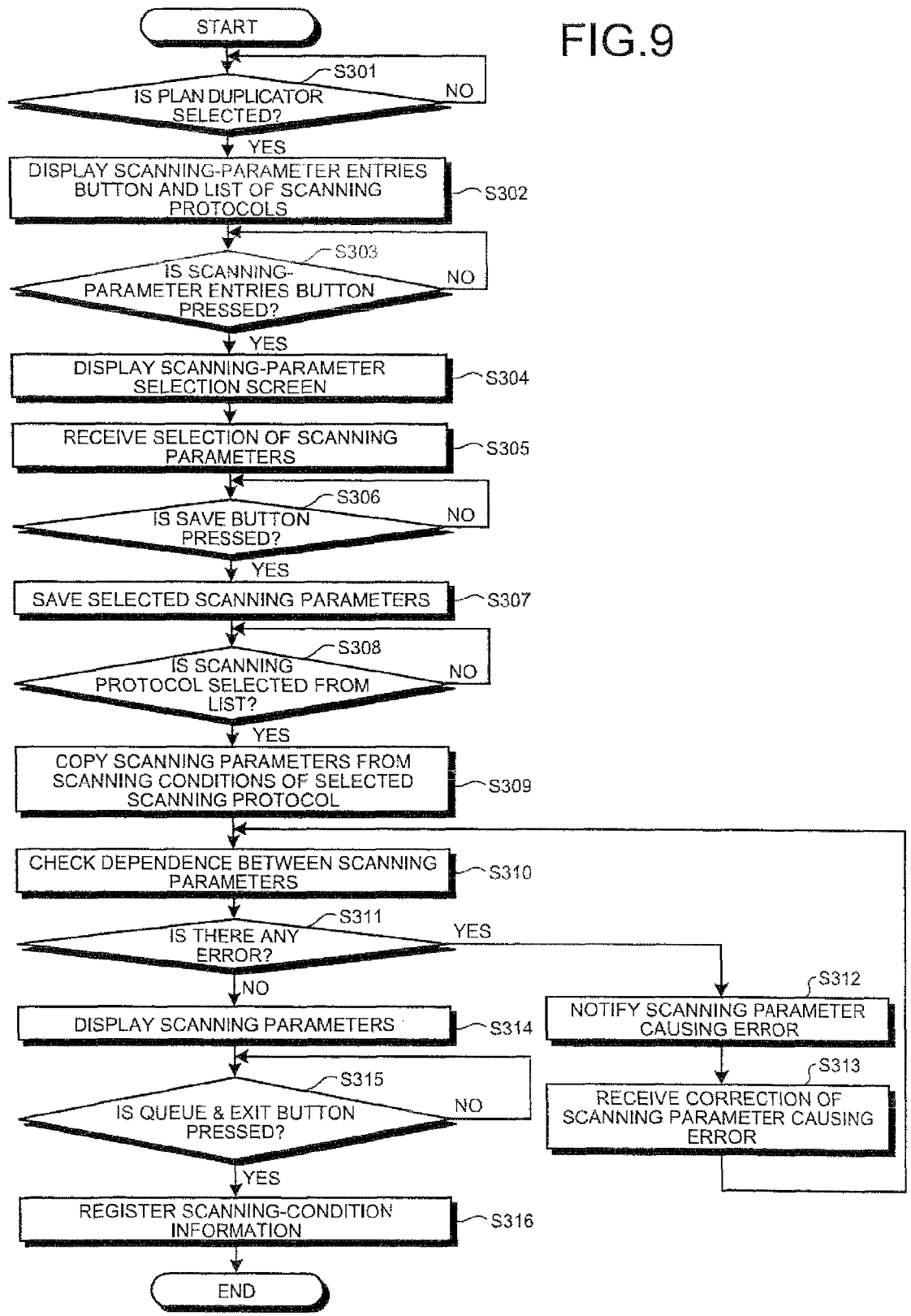
FIG. 9 is a flowchart of a process procedure of scanning-condition setting by plan duplicator according to the embodiment.

A process procedure performed by the console device 100 according to the embodiment is explained below. FIG. 7 is a flowchart of a process procedure of preset-information setting; FIG. 8 is a flowchart of a process procedure of scanning-condition setting by the preset selection; and FIG. 9 is a flowchart of a process procedure of scanning-condition setting by the plan duplicator.

At first, a process procedure of preset-information setting is explained below with reference to FIG. 7. As shown in the figure, in the console device 100, the main control unit 141 displays the preset-information setting screen 10 in response to a request from an operator (Step S101), and receives a selection of scanning parameters and input of a parameter value (Step S102).

When the save button is pressed on the preset-information setting screen 10 (Yes at Step S103), the preset-information setting unit 144 checks a dependence relationship between scanning parameters (Step S104). If there is no error (No at Step S105), the preset-information setting unit 144 registers preset information (Step S106).

By contrast, if an error is found in the dependence relationship (Yes at Step S105), the preset-information setting unit 144 notifies the operator of a scanning parameter causing the error (Step S107). The main control unit 141 then receives a correction of the scanning parameter causing the error from the preset-information setting screen 10 (Step S108), and waits that the save button is pressed again (goes back to Step S103).

In this way, the main control unit 141 and the preset-information setting unit 144 repeat reception of correction of a scanning parameter and checking of the dependence relationship as described above until the dependence relationship between the scanning parameters becomes to have no error.

Then, a process procedure of scanning-condition setting by the preset selection is explained below with reference to FIG. 8. As shown in the figure, in the console device 100, when the operator selects the "preset selection" on the scanning-condition setting screen 20 (Yes at Step S201), the main control unit 141 displays the list 24 of preset names of preset information (Step S202).

When the operator then selects a preset name from the list 24 (Yes at Step S203), the main control unit 141 acquires preset information corresponding to the selected preset name from the preset-information storage unit 132 (Step S204), and the scanning-condition setting unit 145 checks a dependence relationship between scanning parameters included in the preset information acquired by the main control unit 141 (Step S205).

If an error is found in the dependence relationship (Yes at Step S206), the main control unit 141 notifies the operator of a scanning parameter causing the error (Step S207), and waits that the scanning parameter causing the error is to be corrected via the scanning-condition setting screen 20.

When the main control unit 141 then receives a correction of the scanning parameter causing the error (Step S208), the scanning-condition setting unit 145 again checks the dependence relationship between the scanning parameters (goes back to Step S205).

In this way, correction of a scanning parameter and checking of the dependence relationship are performed until the dependence relationship becomes to have no error; and when no error is found (No at Step S206), the main control unit 141 displays the scanning parameters on the scanning-condition setting screen 20 (Step S209).

When the operator then presses the "queue & exit" button (Yes at Step S210), the scanning-condition setting unit 145 registers scanning-condition information into the scanning-condition information storage unit 134 (Step S211).

Then, a process procedure of scanning-condition setting by the plan duplicator is explained below with reference to FIG. 9. As shown in the figure, in the console device 100, when the operator selects the "plan duplicator" on the scanning-condition setting screen 20 (Yes at Step S301), the main control unit 141 displays the scanning-parameter entries button 26 and the list 25 of scanning protocols (Step S302).

When the operator then presses the scanning-parameter entries button 26 (Yes at Step S303), the main control unit 141 displays the scanning-parameter selection screen 30 (Step S304), and receives a selection of scanning parameters from the operator (Step S305).

After that, when the save button 31 is pressed on the scanning-parameter selection screen 30 (Yes at Step S306), the main control unit 141 saves scanning parameters that are selected at the moment into the internal memory (Step S307).

When the operator then selects a scanning protocol from the list 25 of scanning protocols (Yes at Step S308), the main control unit 141 copies scanning parameters corresponding to the scanning parameters saved in the internal memory from among scanning conditions of the selected scanning protocol (Step S309), and the scanning-condition setting unit 145 checks the dependence relationship between the scanning parameters included in the preset information acquired by the main control unit 141 (Step S310).

If an error is found in the dependence relationship (Yes at Step S311), the main control unit 141 notifies the operator of a scanning parameter causing the error (Step S312), and waits that the scanning parameter causing the error is to be corrected via the scanning-condition setting screen 20.

When the main control unit 141 then receives a correction of the scanning parameter causing the error (Step S313), the scanning-condition setting unit 145 again checks the dependence relationship between the scanning parameters (goes back to Step S310).

In this way, correction of a scanning parameter and checking of the dependence relationship are performed until the dependence relationship becomes to have no error; and when no error is found (No at Step S311), the main control unit 141 displays the scanning parameters on the scanning-condition setting screen 20 (Step S314).

When the operator then presses the "queue & exit" button (Yes at Step S315), the scanning-condition setting unit 145 registers scanning-condition information into the scanning-condition information storage unit 134 (Step S316).

As described above, according to the embodiment, the preset-information storage unit 132 stores therein preset information including information on a plurality of scanning parameters that are grouped based on an instruction from the operator; the scanning-condition setting unit 145 sets scanning conditions based on parameter values of the scanning parameters grouped in the preset information stored by the preset-information storage unit 132; accordingly, not only a specific parameter, but also a plurality of arbitrarily-selected scanning parameters can be simultaneously set.

Moreover, according to the embodiment, the preset information stored by the preset-information storage unit 132 includes preset information that indicates a scan aim; and the main control unit 141 receives input of a preset name via the scanning-condition setting screen 20, and acquires preset information corresponding to the received preset name from among the preset information stored by the preset-information storage unit 132. The scanning-condition setting unit 145 then sets scanning conditions based on the parameter values of the scanning parameters grouped in the preset information, accordingly, scanning parameters can be simultaneously set in accordance with an aim of a scan.

Furthermore, according to the embodiment, the main control unit 141 receives input of a scanning protocol that is already set via the scanning-condition setting screen 20, and copies parameter values of scanning parameters corresponding to the scanning parameters grouped in the preset information from the parameter values of the scanning parameters included in the scanning conditions of the input scanning protocol The scanning-condition setting unit 145 then sets scanning conditions based on the parameter values of the scanning parameters, so that a plurality of scanning parameters can be efficiently set by using the scanning conditions of the scanning protocol that are already set.

Moreover, according to the embodiment, the main control unit 141 receives a selection of scanning parameters from the scanning parameters grouped in the preset information stored by the preset-information storage unit 132 via the scanning-parameter selection screen 30; and copies parameter values of scanning parameters matching with the selected scanning parameters when acquiring the scanning parameters from the parameter values of the scanning parameters included in the scanning conditions of a scanning protocol that is already set; accordingly when using the scanning conditions of the scanning protocol that are already set, required scanning parameters can be selected, so that scanning parameters can be more efficiently set.

Furthermore, according to the embodiment, the main control unit 141 receives input of a selection of scanning parameters to be grouped from among a plurality of scanning parameters via the preset-information setting screen 10, and the preset-information setting unit 144 causes the preset-information storage unit 132 to store therein preset information including parameter values of the scanning parameters of which the selection is received by the main control unit 141, so that the operator can arbitrarily select scanning parameters to be simultaneously set as scanning conditions.

Moreover, according to the embodiment, the dependence-information storage unit 133 stores therein dependence information that indicates a dependence relationship between scanning parameters; and when setting scanning conditions based on information about scanning parameters, the scanning condition setting unit 145 checks a dependence relationship between the scanning parameters based on the dependence information stored by the dependence-information storage unit 133; accordingly the dependence relationship between scanning parameters to be set as scanning conditions is automatically checked, so that appropriate scanning conditions can be easily set.

Furthermore, according to the embodiment, the preset-information storage unit 132 stores therein sequence categories and sequences that indicate scanning methods, and the main control unit 141 receives a sequence category and a sequence via the preset-information setting screen 10, and acquires preset information corresponding the sequence category and the sequence that are received from among the preset information stored by the preset-information storage unit 132. The scanning-condition setting unit 145 then sets scanning conditions based on parameter values of the scanning parameters grouped in the preset information, accordingly, appropriate scanning parameters can be simultaneously set in accordance with a scanning method.

Each of the components of each of the devices shown in the drawings in the embodiment is a functional and conceptual example, and it does not need to be physically configured as shown in the drawings. In other words, a practical configuration of distribution and integration of each of the devices is not limited to those shown in the drawings, so that the whole or part of the magnetic resonance imaging apparatus can be distributed or integrated functionally or physically with respect to an arbitrary unit in accordance with a load or a state of use.

As described above, the magnetic resonance imaging apparatus and the scanning-condition setting method according to the embodiment of the present invention are useful when setting a plurality of scanning parameters for a scan as scanning conditions, and particularly suitable when it is required to set not only a specific parameter, but also a plurality of scanning parameters simultaneously.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a preset-information storage unit that stores information for each group as preset information, the information including in a grouped manner a part of scanning parameters included in a plurality of scanning parameters required for a scan;
   a preset-information selecting unit that selects at least one set of preset information from among the preset information stored in the preset-information storage unit, based on an instruction from an operator;
   a scanning-condition setting unit that sets parameter values with respect to scanning parameters that are grouped in the preset information selected by the preset-information selecting unit;
   a data collecting unit that collects data indicating an inside of a body of a subject in accordance with scanning conditions including the parameter values set by the scanning-condition setting unit; and an image reconstructing unit that reconstructs an image from the data collected by the data collecting unit.

2. The apparatus according to claim 1, wherein
the sets of the preset information stored in the preset-information storage unit are associated with respective pieces of identification information arbitrarily set by an operator,
the apparatus further comprises an identification-information input receiving unit that receives from an operator an input of a piece of identification information, and
the preset-information selecting unit selects a set of preset information corresponding to the piece of the identification information received by the identification-information input receiving unit.

3. The apparatus according to claim 2, wherein
the identification information includes information about a scan aim,
the identification-information input receiving unit receives an input of information about the scan aim from an operator, and
the preset-information selecting unit selects preset information corresponding to the information about the scan aim received by the identification-information input receiving unit.

4. The apparatus according to claim 2, wherein
the identification information includes information about a scan method,
the identification-information input receiving unit receives an input of information about the scan method from an operator, and
the preset-information selecting unit selects preset information corresponding to the information about the scan method received by the identification-information input receiving unit.

5. The apparatus according to claim 3, wherein
the identification information includes information about a scan method,
the identification-information input receiving unit receives an input of information about the scan method from an operator, and
the preset-information selecting unit selects preset information corresponding to the information about the scan method received by the identification-information input receiving unit.

6. The apparatus according to claim 1, further comprising:
a scanning-protocol input receiving unit that receives an input of information related to a scanning protocol that is already set, wherein
the scanning-condition setting unit uses parameter values of same scanning parameters included in scanning conditions of a scanning protocol of which information is received by the scanning-protocol input receiving unit, when setting parameter values with respect to the grouped scanning parameters.

7. The apparatus according to claim 2, further comprising:
a scanning-protocol input receiving unit that receives an input of information related to a scanning protocol that is already set, wherein
the scanning-condition setting unit uses parameter values of same scanning parameters included in scanning conditions of a scanning protocol of which information is received by the scanning-protocol input receiving unit, when setting parameter values with respect to the grouped scanning parameters.

8. The apparatus according to claim 3, further comprising:
a scanning-protocol input receiving unit that receives an input of information related to a scanning protocol that is already set, wherein
the scanning-condition setting unit uses parameter values of same scanning parameters included in scanning conditions of a scanning protocol of which information is received by the scanning-protocol input receiving unit, when setting parameter values with respect to the grouped scanning parameters.

9. The apparatus according to claim 6, further comprising:
a scanning-parameter selection receiving unit that receives an operation of selecting at least one scanning parameter from among the scanning parameters grouped in the preset information, wherein
the scanning-condition setting unit uses a parameter value of a same scanning parameter as the scanning parameter selected by the operation received by the scanning-parameter selection receiving unit, from among scanning parameters included in scanning conditions of the scanning protocol received by the scanning-protocol input receiving unit.

10. The apparatus according to claim 7, further comprising:
a scanning-parameter selection receiving unit that receives an operation of selecting at least one scanning parameter from among the scanning parameters grouped in the preset information, wherein
the scanning-condition setting unit uses a parameter value of a same scanning parameter as the scanning parameter selected by the operation received by the scanning-parameter selection receiving unit, from among scanning parameters included in scanning conditions of the scanning protocol received by the scanning-protocol input receiving unit.

11. The apparatus according to claim 8, further comprising:
a scanning-parameter selection receiving unit that receives an operation of selecting at least one scanning parameter from among the scanning parameters grouped in the preset information, wherein
the scanning-condition setting unit uses a parameter value of a same scanning parameter as the scanning parameter selected by the operation received by the scanning-parameter selection receiving unit, from among scanning parameters included in scanning conditions of the scanning protocol received by the scanning-protocol input receiving unit.

12. The apparatus according to claim 1, further comprising:
a scanning-parameter selection receiving unit that receives an operation of selecting scanning parameters to be grouped from among the plurality of scanning parameters; and
a preset-information setting unit that causes the preset-information storage unit to store information that is grouped scanning parameters selected by the operation received by the scanning-parameter selection receiving unit, as the preset information.

13. The apparatus according to claim 2, further comprising:
a scanning-parameter selection receiving unit that receives an operation of selecting scanning parameters to be grouped from among the plurality of scanning parameters; and
a preset-information setting unit that causes the preset-information storage unit to store information that is grouped scanning parameters selected by the operation received by the scanning-parameter selection receiving unit, as the preset information.

14. The apparatus according to claim 3, further comprising:
    a scanning-parameter selection receiving unit that receives an operation of selecting scanning parameters to be grouped from among the plurality of scanning parameters; and
    a preset-information setting unit that causes the preset-information storage unit to store information that is grouped scanning parameters selected by the operation received by the scanning-parameter selection receiving unit, as the preset information.

15. The apparatus according to claim 4, further comprising:
    a scanning-parameter selection receiving unit that receives an operation of selecting scanning parameters to be grouped from among the plurality of scanning parameters; and
    a preset-information setting unit that causes the preset-information storage unit to store information that is grouped scanning parameters selected by the operation received by the scanning-parameter selection receiving unit, as the preset information.

16. The apparatus according to claim 1, further comprising:
    a dependence-information storage unit that stores dependence information indicating a dependence relationship between the scanning parameters, wherein
    the scanning-condition setting unit checks a dependence relationship between the scanning parameters based on the dependence information stored by the dependence-information storage unit, when setting parameter values of the scanning parameters.

17. The apparatus according to claim 2, further comprising:
    a dependence-information storage unit that stores dependence information indicating a dependence relationship between the scanning parameters, wherein
    the scanning-condition setting unit checks a dependence relationship between the scanning parameters based on the dependence information stored by the dependence-information storage unit, when setting parameter values of the scanning parameters.

18. The apparatus according to claim 3, further comprising:
    a dependence-information storage unit that stores dependence information indicating a dependence relationship between the scanning parameters, wherein
    the scanning-condition setting unit checks a dependence relationship between the scanning parameters based on the dependence information stored by the dependence-information storage unit, when setting parameter values of the scanning parameters.

19. The apparatus according to claim 4, further comprising:
    a dependence-information storage unit that stores dependence information indicating a dependence relationship between the scanning parameters, wherein
    the scanning-condition setting unit checks a dependence relationship between the scanning parameters based on the dependence information stored by the dependence-information storage unit, when setting parameter values of the scanning parameters.

20. A scanning-condition setting method comprising:
    storing information in a storage device for each group as preset information, the information including in a grouped manner a part of scanning parameters included in a plurality of scanning parameters required for a scan;
    selecting at least one set of preset information from among the preset information stored in the storage device based on an instruction from an operator;
    setting parameter values with respect to scanning parameters that are grouped in the selected preset information;
    collecting data indicating an inside of a body of a subject in accordance with scanning conditions including the set parameter values; and
    reconstructing an image from the collected data.

* * * * *